(12) United States Patent
Mei et al.

(10) Patent No.: US 11,722,105 B2
(45) Date of Patent: Aug. 8, 2023

(54) RECOVERY CONTROL FOR POWER CONVERTER

(71) Applicant: Texas Instruments Incorporated, Dallas, TX (US)

(72) Inventors: Tawen Mei, Sunnyvale, CA (US); Jiun Heng Goh, Cupertino, CA (US); Robert Blattner, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/498,259

(22) Filed: Oct. 11, 2021

(65) Prior Publication Data

US 2022/0029590 A1    Jan. 27, 2022

Related U.S. Application Data

(63) Continuation of application No. 16/264,311, filed on Jan. 31, 2019, now Pat. No. 11,183,977.

(60) Provisional application No. 62/726,647, filed on Sep. 4, 2018.

(51) Int. Cl.
| | |
|---|---|
| *H03F 3/04* | (2006.01) |
| *H03K 17/687* | (2006.01) |
| *H03F 3/217* | (2006.01) |
| *H03F 1/02* | (2006.01) |

(52) U.S. Cl.
CPC ............. *H03F 3/04* (2013.01); *H03K 17/687* (2013.01); *H03F 1/0244* (2013.01); *H03F 3/217* (2013.01); *H03F 3/2171* (2013.01); *H03F 2200/129* (2013.01)

(58) Field of Classification Search
CPC .......... H03F 3/04; H03F 3/217; H03F 3/2171; H03F 1/0244; H03F 2200/129; H03K 17/687; H02M 1/0022; H02M 1/325; H02M 1/36; H02M 3/156
USPC ......................................... 330/293, 296, 297
See application file for complete search history.

(56) References Cited

U.S. PATENT DOCUMENTS

| | | | |
|---|---|---|---|
| 2008/0197821 A1* | 8/2008 | Hasegawa | H02M 1/32 323/238 |
| 2011/0127980 A1* | 6/2011 | Chen | H02M 3/156 323/282 |
| 2014/0217999 A1 | 8/2014 | Wibben et al. | |
| 2020/0076382 A1 | 3/2020 | Mei et al. | |

* cited by examiner

*Primary Examiner* — Hafizur Rahman
*Assistant Examiner* — Khiem D Nguyen
(74) *Attorney, Agent, or Firm* — Ray A. King; Frank D. Cimino

(57) ABSTRACT

A device includes a first amplifier and a second amplifier. The first amplifier includes an inverting input configured to be coupled to a feedback node of an output of a power converter, a first non-inverting input configured to couple to a first voltage node, a second non-inverting input, and an output. The second amplifier includes an inverting input coupled to the output of the first amplifier, a non-inverting input coupled to a second voltage node, and an output. The device also includes a first transistor coupled to the output of the first amplifier and having a control terminal coupled to the output of the second amplifier, a capacitor coupled to a ground node and to the second non-inverting input of the first amplifier, and a current node coupled to the capacitor.

13 Claims, 3 Drawing Sheets

RECOVERY CONTROL FOR POWER CONVERTER

CROSS-REFERENCE TO RELATED APPLICATIONS

The present application is a continuation of U.S. patent application Ser. No. 16/264,311, which was filed Jan. 31, 2019, which claims priority to U.S. Provisional Patent Application No. 62/726,647, which was filed Sep. 4, 2018, is titled "Recovery Control for Power Converter," and which Applications are hereby incorporated herein by reference in their entirety.

SUMMARY

In accordance with at least one example of the disclosure, a device includes a first amplifier and a second amplifier. The first amplifier includes an inverting input configured to be coupled to a feedback node of an output of a power converter, a first non-inverting input configured to couple to a first voltage node, a second non-inverting input, and an output. The second amplifier includes an inverting input coupled to the output of the first amplifier, a non-inverting input coupled to a second voltage node, and an output. The device also includes a first transistor coupled to the output of the first amplifier and having a control terminal coupled to the output of the second amplifier, a capacitor coupled to a ground node and to the second non-inverting input of the first amplifier, and a current node coupled to the capacitor.

In accordance with another example of the disclosure, a device includes a first amplifier and a second amplifier. The first amplifier includes an inverting input configured to couple to a feedback node of an output of a power converter, a first non-inverting input configured to couple to a first voltage node, a second non-inverting input, and an output. The second amplifier includes an inverting input coupled to a second voltage node, a non-inverting input coupled to the output of the first amplifier, and an output. The device also includes a first transistor coupled to the output of the first amplifier and a ground node and having a control terminal coupled to the output of the second amplifier, a capacitor coupled to the ground node and to the second non-inverting input of the first amplifier, and a second transistor coupled to the capacitor and to the ground node. A control terminal of the second transistor is coupled to the control terminal of the first transistor. The device also includes a current node coupled to the capacitor.

In accordance with yet another example of the disclosure, a system includes a pulse-width modulator (PWM) circuit for a power converter configured to provide an output voltage and a first amplifier configured to generate an output to control the PWM circuit based on a feedback voltage derived from the output voltage, a reference voltage, and a soft start voltage across a capacitor. The system also includes a second amplifier configured to generate an output to discharge the capacitor based on the output of the first amplifier and a clamping voltage.

BRIEF DESCRIPTION OF THE DRAWINGS

For a detailed description of various examples, reference will now be made to the accompanying drawings in which.

DETAILED DESCRIPTION

Figure 1:
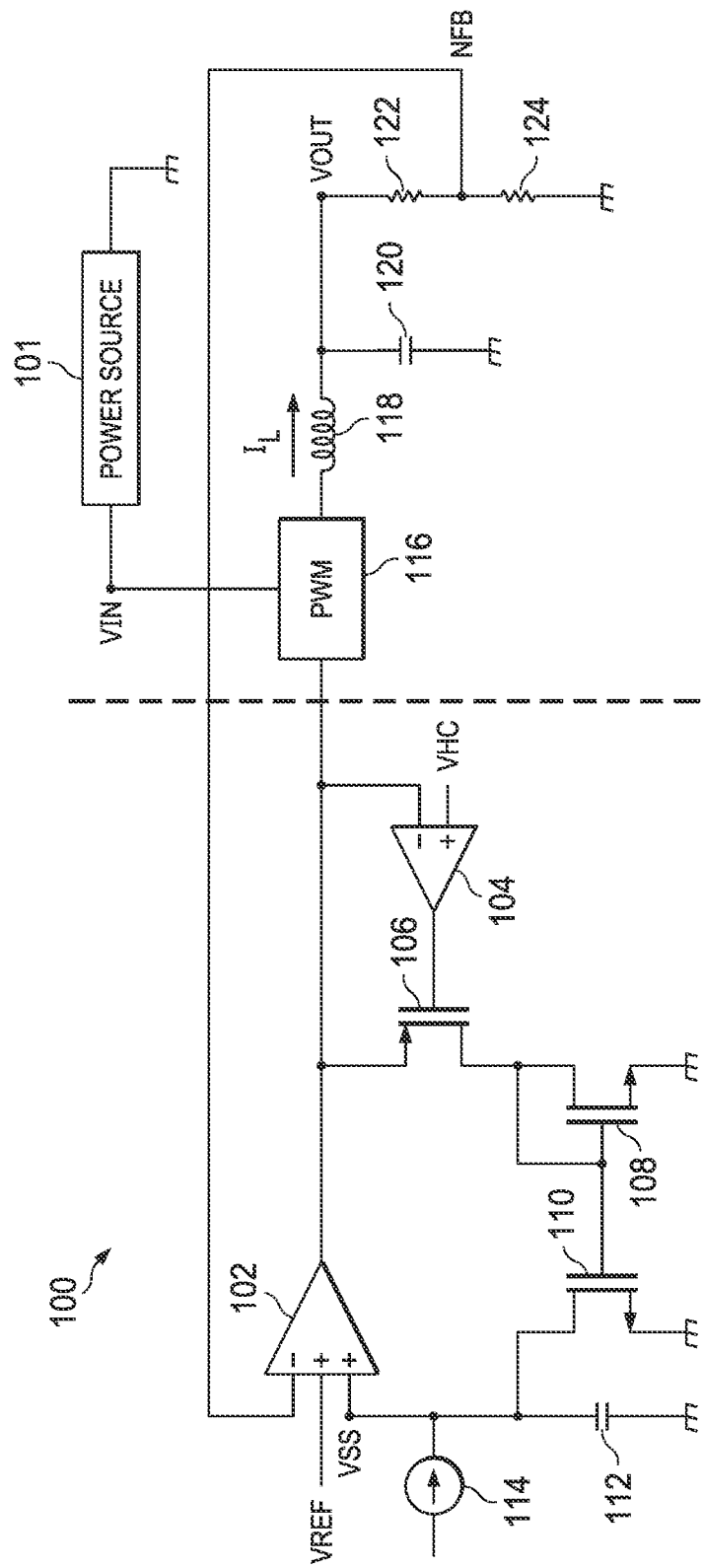
FIG. 1 shows a circuit diagram in accordance with an example.

Switching power converters convert power from a direct current (DC) or alternating current (AC) source to a DC load, such as a personal electronic device. In some cases, the power converter becomes overloaded, for example where a short circuit exists in the load and is drawing too much current (e.g., above a maximum current limit of the power converter). In other cases, the power converter experiences a brownout, where the input voltage to the power converter sags, causing the output voltage of the power converter to follow the input voltage sag. In either case (generically referred to as a fault), a feedback voltage of the power converter, which is the output voltage or a fraction of the output voltage, becomes unacceptably low. Once the fault is resolved, feedback mechanisms result in a delay in restoring the output voltage to its nominal level, or result in an overshoot to the output voltage leading to an inrush current spike, all of which are not desirable.

In one example, an offset in the feedback mechanism causes a soft start voltage, to which the feedback voltage is compared, to be higher than expected (e.g., higher than the feedback voltage following a fault), resulting in a large initial current demand by the power converter that causes an inrush current spike. In another example, the offset in the feedback mechanism causes the soft start voltage to be lower than expected (e.g., lower than the feedback voltage following a fault), resulting in a delay in beginning regulation as the soft start voltage catches up with the feedback voltage, for example as a capacitor that provides the soft start voltage is charged. These problems are exacerbated because a low output voltage (and corresponding feedback voltage), causes feedback control circuits to operate in an open-loop fashion, where the power converter is controlled to deliver a maximum current regardless of the particular output and feedback voltages. For example, since the output and feedback voltage are too low (e.g., out of range), the feedback mechanism controls the power converter to deliver a maximum current until the feedback voltage is approximately equal to the rising soft start voltage allowing proper regulation of the power converter. In either case, the presence of the offset in the feedback mechanism introduces inaccuracies regarding how the power converter will be regulated following a fault, which is also not desirable.

Examples of the present disclosure include a feedback control circuit for a power converter that regulates a capacitor that provides the soft start voltage during a fault to facilitate a soft start recovery of the output voltage once the fault is resolved. During a fault when a feedback voltage is low, an error amplifier of the feedback control circuit will attempt to drive a pulse width modulator (PWM) circuit coupled to the error amplifier output to increase a current provided by the power converter. However, a clamping amplifier also coupled to the error amplifier output limits the voltage of the error amplifier output to a clamping voltage by sinking current from the error amplifier output when it exceeds the clamping voltage. When the clamping amplifier operates to clamp the error amplifier output in this manner, one or more transistors are also operated to discharge the capacitor that provides the soft start voltage. Thus, the output of the error amplifier regulates the soft start voltage in a closed-loop manner, which avoids the need for a separate circuit to determine whether to regulate the soft start voltage, saving power and reducing complexity. Subsequently, when the fault condition ceases, since the capacitor that provides the soft start voltage is discharged, the feedback control circuit facilitates a normal soft start, which results in a smooth recovery to the output voltage without delay and avoiding an inrush current spike.

FIG. 1 depicts an example circuit to address the challenges described above. In FIG. 1, a pulse width modulator circuit (PWM) 116 provides power conversion by modulating the output current command or duty cycle of its output based on an input received from an error amplifier 102. The PWM circuit 116 represents the power converter for purposes of simplicity and the scope of this disclosure is not limited to a certain power converter topology, but rather addresses the problems noted above when an output voltage (or associated feedback voltage) for power converter control becomes unacceptably low, for example due to a fault. A power source 101 is coupled to the PWM circuit 116 and provides an input voltage (VIN, which is also used to refer to the node at VIN) as an input voltage for a power converter topology. An output inductor 118 is coupled to PWM 116 and a node at an output voltage (VOUT, which is also used to refer to the node at VOUT). An output capacitor 120 is coupled between VOUT and a ground node. A voltage divider comprising resistors 122 and 124 is also coupled between VOUT and ground. A feedback voltage (VFB, which is also used to refer to the node at VFB) is generated at the node between the resistors 122 and 124.

A feedback control circuit 100 is coupled to the PWM circuit 116. The feedback control circuit 100 includes the aforementioned error amplifier 102, which in this example is a 3-input error amplifier 102. The error amplifier 102 has two non-inverting inputs (the lower value of which controls) and one inverting input. For example, when a first of the non-inverting inputs is at a lower voltage than a second of the non-inverting inputs, the output of the error amplifier 102 is based on a comparison of the first of the non-inverting inputs and the inverting input. In another example, when the second of the non-inverting inputs is at a lower voltage than the first of the non-inverting inputs, the output of the error amplifier 102 is based on a comparison of the second of the non-inverting inputs and the inverting input. The inverting input of the error amplifier 102 is coupled to VFB. One of the non-inverting inputs of the error amplifier 102 is coupled to a node at a reference voltage (VREF, which is also used to refer to the node at VREF), while the other non-inverting input of the error amplifier 102 is coupled to a node at a soft start voltage (VSS, which is also used to refer to the node at VSS). In an example, VREF is generated by a separate reference circuit (not shown for simplicity) and has a value corresponding to VFB when VOUT is regulated to a particular level. A capacitor 112 is coupled to VSS and to a ground node, and a current node 114 charges the capacitor 112. The error amplifier 102 compares VFB to the lesser of VREF and VSS, and the output of the error amplifier 102 is proportional to the difference between the inverting terminal and the lesser of the non-inverting terminals.

As explained above, the output of the error amplifier 102 controls or modulates the output current command level or duty cycle of the PWM circuit 116 to increase or decrease the amount of output current (IL, through the output inductor 118) provided to a load coupled to VOUT. For example, an increase in the voltage of the output of the error amplifier 102 causes the PWM circuit 116 to increase its output current command level or duty cycle, resulting in an increase in output current. Similarly, a decrease in the voltage of the output of the error amplifier 102 causes the PWM circuit 116 to decrease its output current command level or duty cycle, resulting in a decrease in output current.

The feedback control circuit 100 also includes a clamping amplifier 104, which comprises a non-inverting input and an inverting input. The inverting input of the clamping amplifier 104 is coupled to the output of the error amplifier 102. The non-inverting input of the clamping amplifier 104 is coupled to a node at a clamping reference voltage (VHC, which is also used to refer to the node at VHC). In an example, VHC is also generated by a separate reference circuit (not shown for simplicity) and has a value corresponding to the maximum current that the power converter can deliver or the maximum duty cycle ratio that the power converter can tolerate. For example, when the error amplifier 102 output is equal to VHC, the PWM circuit 116 is controlled to deliver the maximum current that the power converter can deliver. The clamping amplifier 104 compares the output of the error amplifier 102 to VHC, and the output of the clamping amplifier 104 is proportional to the difference between VHC and the output of the error amplifier 102.

The feedback control circuit 100 also includes transistors 106, 108, 110, which in this example comprise metal-oxide-semiconductor field-effect transistors (MOSFETs) having a gate, a source, and a drain. In this example, the transistor 106 comprises a p-type MOSFET while the transistors 108, 110 comprise n-type MOSFETs. An output of the clamping amplifier 104 is coupled to the gate of the p-type MOSFET 106, while the output of the error amplifier 102 is coupled to the source of the p-type MOSFET 106. The drain of the p-type MOSFET 106 is coupled to the drain of the n-type MOSFET 108, which is also coupled to the gate of the n-type MOSFET 108. The source of the n-type MOSFET 108 is coupled to a ground node. The gate of the n-type MOSFET 108 is also coupled to the gate of the n-type MOSFET 110. The source of the n-type MOSFET 110 is coupled to a ground node, while the drain of the n-type MOSFET 110 is coupled to the capacitor 112. In an example the n-type MOSFETs 108, 110 together act as a current mirror.

Figure 2:
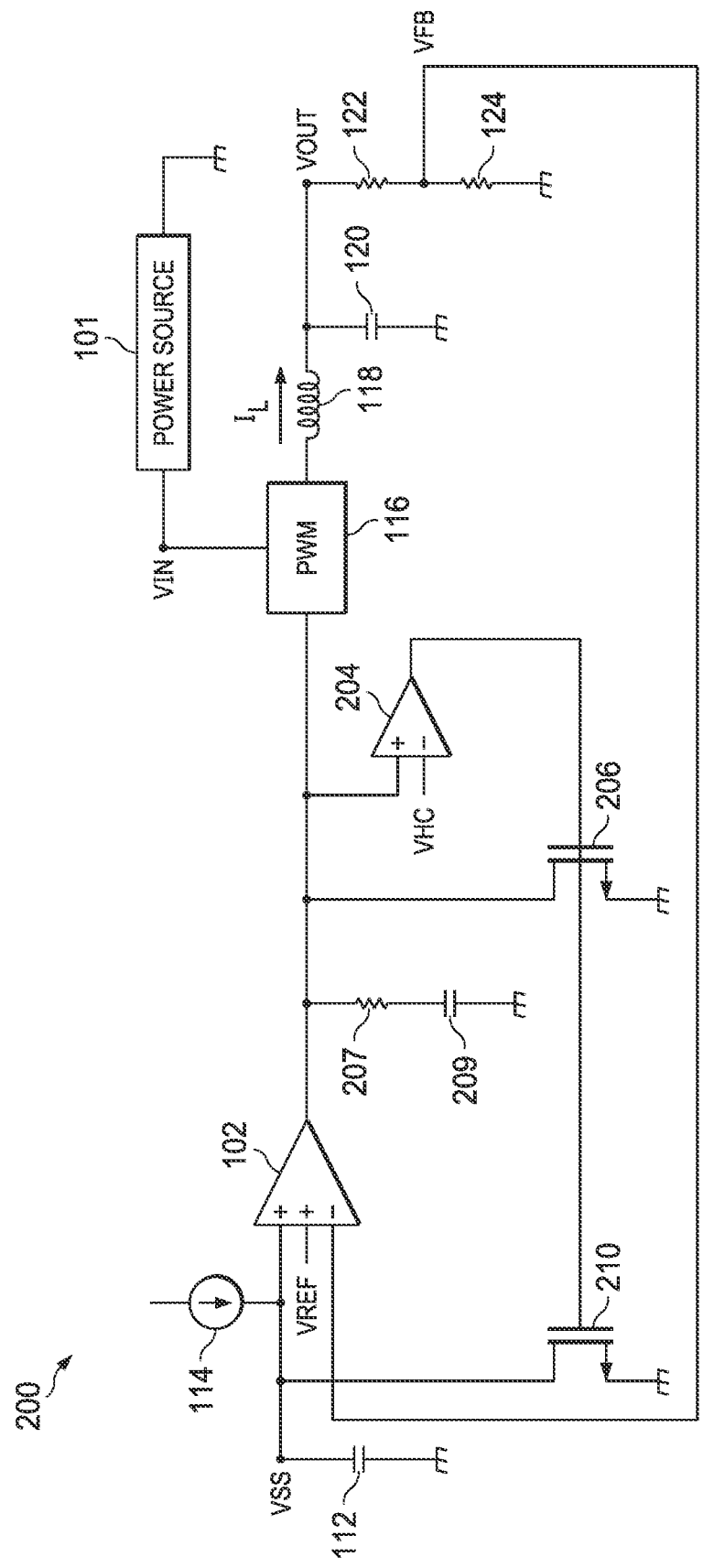
FIG. 2 shows another circuit diagram in accordance with an example.

FIG. 2 depicts another example of a feedback control circuit 200 to address the challenges described above. The PWM circuit 116, inductor 118, capacitor 120, and resistors 122, 124 are similar to those described above with respect to FIG. 1. Additionally, the error amplifier 102, the capacitor 112, and the current node 114 are similar to those described above with respect to FIG. 1. The clamping amplifier 204 is also similar to the clamping amplifier 104, although its terminals are switched as will be explained further below.

The feedback control circuit 200 also includes transistors 206 and 210, which in this example comprise n-type MOSFETs having a gate, a source, and a drain. An output of the clamping amplifier 204 is coupled to the gate of the n-type MOSFET 206, while the output of the error amplifier 102 is coupled to the drain of the n-type MOSFET 206. The source of the n-type MOSFET 206 is coupled to a ground node. The gate of the n-type MOSFET 206, and thus the output of the clamping amplifier 204, is also coupled to the gate of the n-type MOSFET 210. The source of the n-type MOSFET 210 is coupled to a ground node, while the drain of the n-type MOSFET 210 is coupled to the capacitor 112. A resistor 207 and a capacitor 209 are coupled to the output of the error amplifier 102 and to a ground node and serve as a compensation network to provide additional stability to the output voltage of the error amplifier 102.

Figure 3:
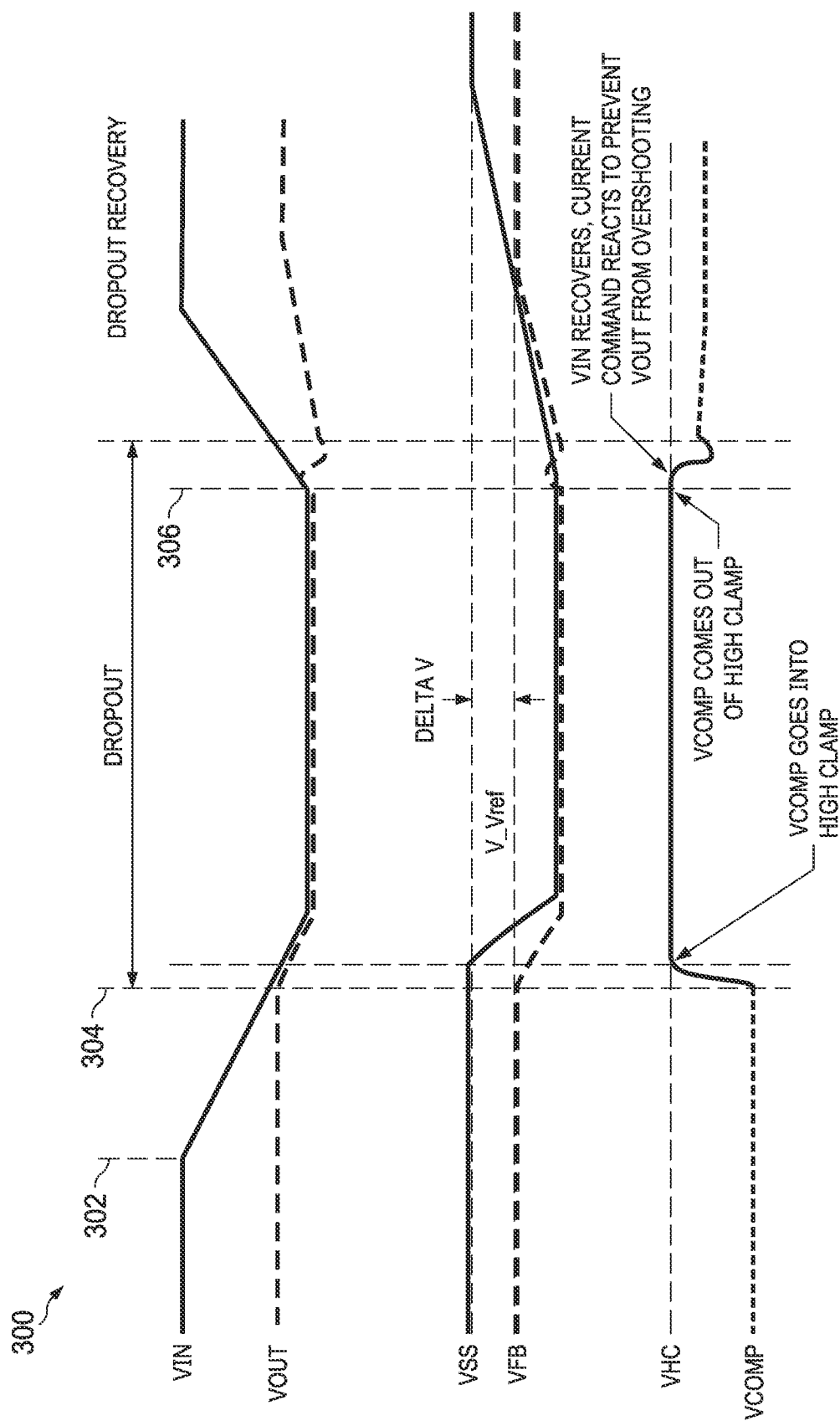
FIG. 3 shows voltage waveforms corresponding to the functionality of the circuits of FIGS. 1 and 2 in accordance with an example.

FIG. 3 shows a set of waveforms 300 and the function of both feedback control circuits 100, 200 is explained with respect to these waveforms 300. The VIN waveform corresponds to the voltage at VIN. The VOUT waveform corresponds to the voltage at VOUT. The VSS waveform corresponds to the voltage across the capacitor 112 that is provided as an input to the error amplifier 102. The VFB waveform corresponds to the voltage at VFB. The VCOMP waveform corresponds to the output voltage of the error amplifier 102. The VREF and VHC levels represent the reference voltages applied to the error amplifier 102 and the clamping amplifier 104, 204, respectively.

Although not depicted in FIG. 3, prior to startup of the power converter, the voltage across the capacitor 112 (VSS) is zero. Thus, upon startup of the power converter, the current node 114 begins to charge the capacitor 112, causing VSS to increase linearly. VREF is provided by a reference circuit, and thus is provided as an input to the error amplifier 102 upon startup. Initially, VSS is lower than VREF, and thus causes the error amplifier 102 output to regulate VFB according to VSS. VFB ramps up according to the slew rate of VSS, which is in turn controlled by the current node 114 and the capacitor 112. The controlled ramp up of VSS prevents an inrush current, for example to the output capacitor 120. Depending on the capacitance of the capacitor 112, VSS increases beyond VREF in some examples as the capacitor 112 is charged, and thus VREF takes control and causes the error amplifier 102 output to regulate VFB according to VREF.

During normal operation at time 302, in an example the capacitor 112 is charged to produce a voltage VSS that is higher than VREF, such that VREF remains the lower of the two voltages supplied to the non-inverting terminals of the error amplifier 102 (e.g., the value of the capacitor 112 is selected to achieve such voltage levels). When a fault is not present, VFB is tracking VREF through the power stage control feedback loop (e.g., including the error amplifier 102, the PWM circuit 116, the output inductor 118, the output capacitor 120, and the voltage divider 122, 124), and thus the output of the error amplifier 102 is biased between its minimum and maximum potential. As a result, the PWM circuit 116 converts the error amplifier 102 output to influence its power converter output current or duty cycle to provide more or less current as needed, based on the output load current requested through feedback of VFB, which drops in response to an increased output load due to the capacitor 120 providing the instantaneous load transient, and which rises in response to a decreased output load due to a transient overcharging of VOUT by the PWM circuit 116).

After time 302, VIN begins to drop (e.g., a brownout) and at time 304, VIN falls below VOUT, which causes VOUT to fall as well. When such a fault occurs, VFB as a function of VOUT also decreases to a low value (below VREF and VSS), causing the output of the error amplifier 102 to increase.

Referring to the example of FIG. 1, when the output of the error amplifier 102 begins to exceed its maximum allowed clamping voltage (VHC), the clamping amplifier 104 generates a decreased output sufficient to turn the p-type MOSFET 106 on. The current through the p-type MOSFET 106 is mirrored through the current mirror comprising the n-type MOSFETs 108, 110, which discharges the capacitor 112. Once the capacitor 112 is discharged such that VSS is approaching VFB, the output current of the error amplifier 102 will start to decrease. The clamping amplifier 104 then reduces the current through the p-type MOSFET 106 such that the n-type MOSFET 110 discharges current at approximately the same rate as provided by the current node 114, and VSS approaches VFB. Thus, the output of the error amplifier 102 regulates the capacitor 112 that provides VSS in a closed-loop manner, which avoids the need for a separate circuit to determine whether to regulate VSS, saving power and reducing complexity.

Referring to the example of FIG. 2, as explained above the terminals of the clamping amplifier 204 are switched relative to FIG. 1. As a result, when the output of the error amplifier 102 begins to exceed its maximum allowed clamping voltage (VHC), the clamping amplifier 204 generates an increased output sufficient to turn the n-type MOSFET 206 on. The n-type MOSFET 210 is also turned on, which discharges the capacitor 112. Once the capacitor 112 is discharged such that VSS is approaching VFB, the output current of the error amplifier 102 will start to decrease. The clamping amplifier 104 then reduces the current through the n-type MOSFETs 206, 210 such that the n-type MOSFET 210 discharges current at approximately the same rate as provided by the current node 114, and VSS approaches VFB. Similar to above, the output of the error amplifier 102 regulates the capacitor 112 that provides VSS in a closed-loop manner, which avoids the need for a separate circuit to determine whether to regulate VSS, saving power and reducing complexity.

Referring to the example of FIG. 1, when VIN begins to rise at time 306, VFB recovers to a level just above the lesser of the non-inverting terminals of the error amplifier 102 (VSS during recovery). When VFB briefly increases above VSS, the output of the error amplifier 102 (VCOMP) decreases below VHC with minimal delay. The output of the error amplifier 102 also decreases the power stage current level to reduce VOUT overshoot, and the clamping amplifier 104 turns the p-type MOSFET 106 fully off, which in turn turns the n-type MOSFETs 108, 110 of the current mirror off. The current node 114 then gradually charges the capacitor 112 with a controlled slew rate, and VSS gradually increases, causing a gradual increase in the output of the error amplifier 102, which then increases the current of the power stage to charge VOUT in such a manner such that VFB tracks VSS. As VSS is pre-regulated close to VFB during the fault, when the fault ceases, a normal soft start takes place, resulting in a smooth recovery to the output voltage without delay.

Referring to the example of FIG. 2, when VIN begins to rise at time 306, VFB recovers to a level just above the lesser of the non-inverting terminals of the error amplifier 102 (VSS during recovery). When VFB briefly increases above VSS, the output of the error amplifier 102 (VCOMP) decreases below VHC with minimal delay. The output of the error amplifier 102 also decreases the power stage current level to reduce VOUT overshoot, and the clamping amplifier 204 turns the n-type MOSFETs 206, 210 fully off. The current node 114 then gradually charges the capacitor 112 with a controlled slew rate, and VSS gradually increases, causing a gradual increase in the output of the error amplifier 102, which then increases the current of the power stage to charge VOUT in such a manner such that VFB tracks VSS. As VSS is pre-regulated close to VFB during the fault, when the fault ceases, a normal soft start takes place, resulting in a smooth recovery to the output voltage without delay.

Although the example of FIG. 3 is described with respect to a brownout-type fault (e.g., sagging input voltage), VOUT and thus VFB could also drop in response to overloading, such as a short circuit at a load coupled to VOUT. In this example, the PWM circuit 116 is unable to provide sufficient output current, causing VOUT and thus VFB to decrease. The behavior of the feedback control circuits 100, 200 is similar to as described above in such an example.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
    a capacitor;
    a current source coupled to the capacitor;
    at least one transistor coupled to the capacitor and configured to discharge the capacitor;
    an error amplifier having first and second error amplifier inputs and an error amplifier output, wherein the first error amplifier input is coupled to the current source, the error amplifier output is coupled to the at least one transistor, and the error amplifier is configured to provide a pulse width modulation (PWM) signal at the error amplifier output; and
    a clamping amplifier having a clamping amplifier input and a clamping amplifier output, wherein the clamping amplifier is configured to:
        receive the PWM signal at the clamping amplifier input; and
        provide a clamping signal at the clamping amplifier output responsive to the PWM signal, the clamping signal controlling the at least one transistor.

2. The device of claim 1, wherein the at least one transistor includes:
    a first transistor having first and second current terminals and a first control terminal, wherein the first current terminal is coupled to the error amplifier output, and the first control terminal is coupled to the clamping amplifier output;
    a second transistor having third and fourth current terminals and a second control terminal, wherein the third current terminal is coupled to the second current terminal, and the second control terminal is coupled to the third current terminal; and
    a third transistor having fifth and sixth current terminals and a third control terminal, wherein the third control terminal is coupled to the second control terminal, and the fifth current terminal is coupled to the first error amplifier input.

3. The device of claim 1, wherein the at least one transistor includes:
    a first transistor having first and second current terminals and a first control terminal, wherein the first current terminal is coupled to the error amplifier output, and the first control terminal is coupled to the clamping amplifier output; and
    a second transistor having third and fourth current terminals and a second control terminal, wherein the second control terminal is coupled to the first control terminal, and the third current terminal is coupled to the first error amplifier input.

4. The device of claim 1, further comprising:
    a PWM circuit having a PWM input and a PWM output, wherein the PWM input is coupled to the error amplifier output;
    an inductor having first and second inductor terminals, wherein the first inductor terminal is coupled to the PWM output;
    a first resistor having first and second resistor terminals, wherein the first resistor terminal is coupled to the second inductor terminal, and the second resistor terminal is coupled to the second error amplifier input; and
    a second resistor having third and fourth resistor terminals, wherein the third resistor terminal is coupled to the second resistor terminal.

5. A device, comprising:
    a capacitor;
    a first amplifier having a first amplifier input and a first amplifier output, wherein the first amplifier is configured to:
        receive a signal at the first amplifier input; and
        provide a clamping signal at the first amplifier output controlling a discharge of the capacitor responsive to the signal;
    a second amplifier having a second amplifier input and a second amplifier output, wherein the second amplifier output is coupled to the first amplifier input;
    a first transistor having first and second current terminals and a first control terminal, wherein the first current terminal is coupled to the second amplifier output, and the first control terminal is coupled to the first amplifier output; and
    a second transistor having third and fourth current terminals and a second control terminal, wherein the third current terminal coupled to the second current terminal and the second control terminal coupled to the third current terminal; and
    a third transistor having fifth and sixth current terminals and a third control terminal, wherein the third control terminal is coupled to the second control terminal, and the fifth current terminal is coupled to the second amplifier input.

6. The device of claim 5, further comprising:
    a PWM circuit having a PWM input and a PWM output, wherein the PWM input is coupled to the second amplifier output;

an inductor having first and second inductor terminals, wherein the first inductor terminal is coupled to the PWM output;
a first resistor having first and second resistor terminals, wherein the first resistor terminal is coupled to the second inductor terminal, and the second resistor terminal is coupled to the second amplifier input; and
a second resistor having third and fourth resistor terminals, wherein the third resistor terminal is coupled to the second resistor terminal.

7. The device of claim 5, further comprising a current source coupled to the capacitor.

8. A system comprising:
a first amplifier having first, second and third amplifier inputs and a first amplifier output, wherein the first amplifier input is coupled to a feedback voltage terminal providing a feedback voltage, the second amplifier input is coupled to a reference voltage terminal providing a reference voltage, the third amplifier input is coupled to a soft-start voltage terminal providing a soft-start voltage, and the first amplifier is configured to provide an amplifier output at the first amplifier output responsive to the feedback voltage, the reference voltage and the soft-start voltage; and
a second amplifier having fourth and fifth amplifier inputs and a second amplifier output, wherein the fourth amplifier input is coupled to the first amplifier output, the fifth amplifier input is coupled to a clamping voltage input, and the second amplifier is configured to provide a voltage at the second amplifier output responsive to the first amplifier output and the clamping voltage input;
a pulse width modulation (PWM) circuit having a PWM input and a PWM output, wherein the PWM input is coupled to the second amplifier output;
an inductor having first and second inductor terminals, wherein the first inductor terminal is coupled to the PWM output;
a first resistor having first and second resistor terminals, wherein the first resistor terminal is coupled to the second inductor terminal; and
a second resistor having third and fourth resistor terminals, wherein the third resistor terminal is coupled to the second resistor terminal, and a feedback voltage is provided at the third resistor terminal.

9. The system of claim 8, wherein:
the first amplifier input is an inverting input;
the second amplifier input is a non-inverting input; and
the third amplifier input is a non-inverting input.

10. The system of claim 8, further comprising a capacitor coupled to the third amplifier input.

11. The system of claim 10, further comprising:
a first transistor having first and second current terminals and a first control terminal, wherein the first current terminal is coupled to the first amplifier output, and the first control terminal is coupled to the second amplifier output;
a second transistor having third and fourth current terminals and a second control terminal, wherein the third current terminal is coupled to the second current terminal, and the fourth current terminal is coupled to a ground terminal;
a third transistor having fifth and sixth current terminals and a third control terminal, wherein the fifth current terminal is coupled to the capacitor, the sixth current terminal is coupled to the ground terminal, and the third control terminal is coupled to the second control terminal; and
a current source coupled to the capacitor.

12. The system of claim 10, further comprising:
a first transistor having first and second current terminals and a first control terminal, wherein the first current terminal is coupled to the first amplifier output, the second current terminal is coupled to a ground terminal, and the first control terminal coupled to the second amplifier output;
a second transistor having third and fourth current terminals and a second control terminal, wherein the third current terminal is coupled to the capacitor, the fourth current terminal is coupled to the ground terminal, and the second control terminal is coupled to the first control terminal; and
a current source coupled to the capacitor.

13. The system of claim 10, further comprising a current source coupled to the capacitor.

* * * * *